US009000761B2

(12) United States Patent
Tay et al.

(10) Patent No.: US 9,000,761 B2
(45) Date of Patent: Apr. 7, 2015

(54) HALL-EFFECT SENSOR ISOLATOR

(75) Inventors: Gary Tay, Singapore (SG); Dominique Ho, Singapore (SG); Meng Yong Shie, Singapore (SG)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 262 days.

(21) Appl. No.: 13/353,494

(22) Filed: Jan. 19, 2012

(65) Prior Publication Data
US 2013/0187644 A1  Jul. 25, 2013

(51) Int. Cl.
*G01R 33/07* (2006.01)

(52) U.S. Cl.
CPC .................................... *G01R 33/072* (2013.01)

(58) Field of Classification Search
USPC .......................................................... 324/251
See application file for complete search history.

(56) References Cited

U.S. PATENT DOCUMENTS

| 4,616,188 | A | 10/1986 | Stitt et al. |
|---|---|---|---|
| 4,875,011 | A | 10/1989 | Namiki et al. |
| 4,931,719 | A | 6/1990 | Murata et al. |
| 5,572,058 | A | 11/1996 | Biard |
| 6,356,068 | B1 * | 3/2002 | Steiner et al. ............. 324/117 H |
| 6,373,241 | B1 | 4/2002 | Weber et al. |
| 6,879,145 | B1 | 4/2005 | Harris |
| 7,042,208 | B1 | 5/2006 | Harris |
| 7,746,056 | B2 | 6/2010 | Stauth et al. |
| 7,772,661 | B2 | 8/2010 | Kilian |
| 7,816,905 | B2 | 10/2010 | Doogue et al. |
| 2005/0030018 | A1 * | 2/2005 | Shibahara et al. ............. 324/251 |
| 2005/0248336 | A1 * | 11/2005 | Sharma et al. ............. 324/117 H |
| 2008/0136399 | A1 * | 6/2008 | Alfano et al. ................. 323/301 |
| 2008/0143329 | A1 * | 6/2008 | Ishihara ........................ 324/251 |
| 2008/0297138 | A1 * | 12/2008 | Taylor et al. ............. 324/117 H |
| 2010/0045282 | A1 | 2/2010 | Shibasaki |
| 2011/0248711 | A1 * | 10/2011 | Ausserlechner .............. 324/251 |
| 2012/0001649 | A1 * | 1/2012 | Porter et al. ................... 324/721 |
| 2013/0015843 | A1 * | 1/2013 | Doogue et al. ................ 324/202 |
| 2013/0020660 | A1 * | 1/2013 | Milano et al. ................. 257/427 |
| 2013/0049746 | A1 * | 2/2013 | Strutz et al. ................... 324/251 |

* cited by examiner

*Primary Examiner* — Bot Ledynh

(57) ABSTRACT

A coupler is disclosed that employs hall-effect sensing technology. Specifically, the coupler is configured to produce an output voltage by converting the magnetic field generated by a current conductor at an input side. The output and input sides may be electrically isolated from one another but may be coupled via the hall-effect sensing technology, such as a hall-effect sensor.

20 Claims, 5 Drawing Sheets

HALL-EFFECT SENSOR ISOLATOR

FIELD OF THE DISCLOSURE

The present disclosure is generally directed couplers and specifically those that employ hall-effect sensing technology.

BACKGROUND

Frequently in industrial applications, a high voltage and/or high current system must be monitored to ensure that the electrical power properties of the system meet select criteria, such as remaining within a voltage range, and/or remaining within a current range. Such systems frequently have power variations and fluctuations, such as transients, which can potentially damage sensitive equipment and controllers.

One solution to problems caused by transients, which is recognized in industry, is gap isolation of the controller via optocouplers, inductance couplers, capacitor couplers, or other gap isolation circuits.

By way of example, an optocoupler is an electronic device that transfers an electrical signal across an isolation gap by converting the electrical signal to optical light, and back to an electrical signal after passing through an insulation medium. The main objective of optocouplers is to provide high voltage isolation protection on the outside of the circuit, when there is a surge or spike in the voltage rating on the input side.

A typical optocoupler needs a light source, such as a Light Emitting Device (LED), a photodetector, and an insulation medium. The insulation medium of the optocoupler can be either transparent polyimide or epoxy molding compound that allow optical light to pass through.

One limitation of existing optocouplers is that they cannot take in the high current directly. Rather, the incoming current is often passed through external resistors to limit the current, thereby increasing the costs associated with implementing the optocoupler.

Other gap isolators operate similarly with a different type of signal being transmitted across the gap. For instance, an inductance coupler will convert the signal to inductance and then back into an analog electrical signal instead of using an optical signal. While such an arrangement addresses the potential problems caused by a high voltage load in direct connection with a controller, it can give rise to other problems such as scaling factors and the like.

BRIEF DESCRIPTION OF THE DRAWINGS

The present disclosure is described in conjunction with the appended figures.

DETAILED DESCRIPTION

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

As can be seen in FIGS. 1-4, a coupling system 100 for use in a coupler will be described. The coupling system 100 may be incorporated into any system which requires current and/or voltage monitoring, but is susceptible to transients. In some embodiments, the coupling system 100 is rated to operate at about 5 kV or more. Stated another way, the coupling system 100 may be incorporated into a coupler and the input of that coupler may directly connected to a 5 kV source without damaging the coupler or its components. Accordingly, the coupling system 100 may be configured to operate in high-voltage or high-current systems.

Although the coupling system 100 will be described in detail below, it should be appreciated that the coupling system 100 may be incorporated into a coupler by molding or otherwise encapsulating the contents of the coupling system 100 in a plastic as is known in the chip-manufacturing arts. Suitable materials that may be used to mold the coupling system 100 with an and complete the construction of a coupler include, without limitation, plastics or polymers such as polyphthalamide (PPA), silicone, epoxy, any other insulating material, or combinations thereof.

Figure 1:
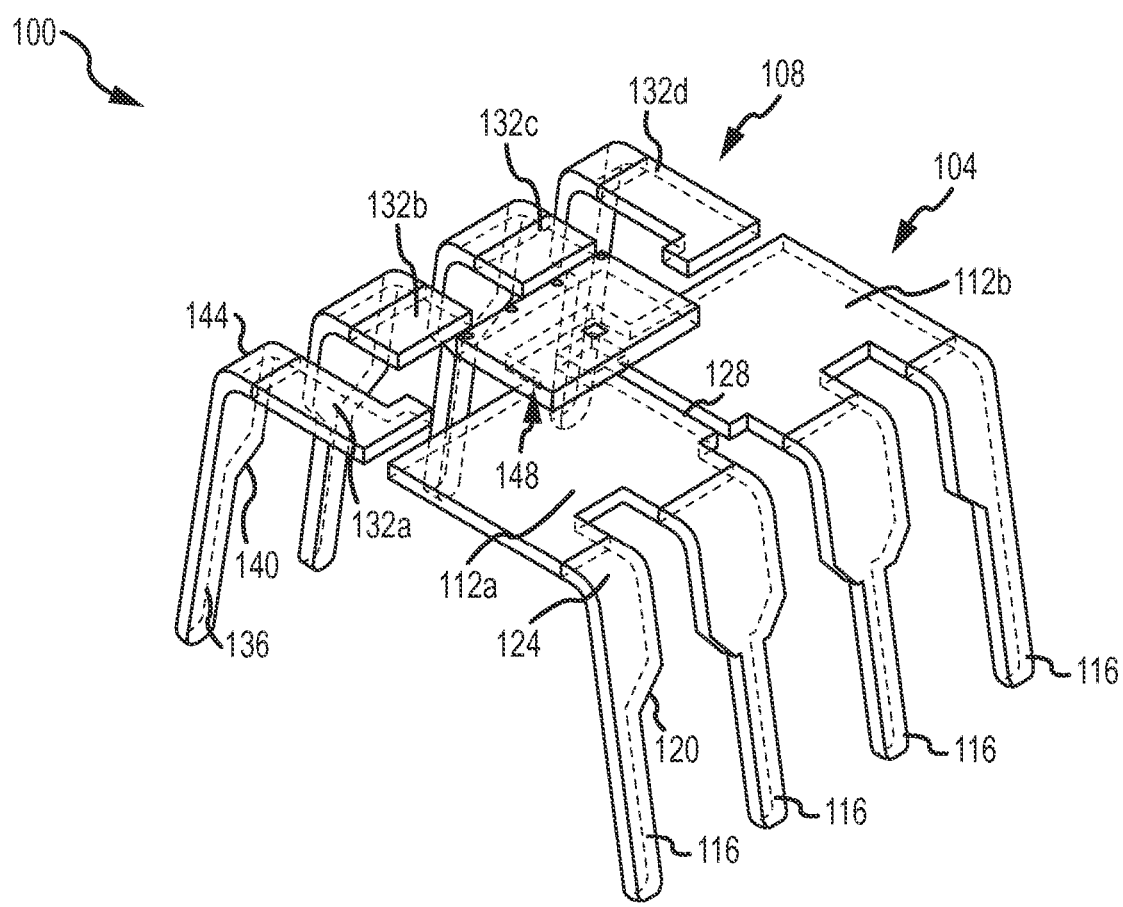
FIG. 1 is a perspective view of a leadframe and sensor element used for a coupler in accordance with embodiments of the present disclosure.

Referring initially to FIG. 1, in some embodiments the coupling system 100 comprises an input side 104 and an output side 108 separated from one another via a gap. The gap between the input side 104 and the output side 108 may be filled with air, gas, liquid, plastic, or any other medium which substantially prevents current from passing directly from the input side 104 to the output side 108. In other words, the input side 104 is electrically isolated from the output side 108. The input side 104 may be connected to a circuit whose current and/or voltage is being measured and the output side 108 may be connected to measurement and/or control circuitry.

Both the input side 104 and output side 108 may be constructed of similar or identical materials. Specifically, the input side 104 and output side 108 and the features of each may be manufactured from a single sheet of metal that is stamped, etched, cut, folded, bent, welded, etc. It should be appreciated that any conductive material may be used for constructing the input side 104 and/or output side 108, which may collectively be referred to as the leadframe of the coupling system 100. As some non-limiting examples, the leadframe (e.g., the input side 104 and output side 108) may be constructed of metal (e.g. copper, silver, gold, aluminum, etc.), graphite, and/or conductive polymers. It may also be possible that the input side 104 and output side 108 are constructed from different materials.

In some embodiments, the input side 104 may comprise a first section of the input leadframe 112a and a second section of the input leadframe 112b, each of which has a plurality of pins 116. In the depicted example, the first and second sections 112a, 112b may be co-planar to one another. The planar top portion of the first section 112a may be connected to one or more pins 116 via a combination of a joint 124 and taper 120. Additionally, a gap 128 may reside between most of the first section 112a and most of the second section 112b.

The pins 116, taper 120, and shoulder 124 may be collectively referred to as leads. Although embodiments of the present disclosure show the leads as having a specific configuration (e.g., straight-cut leads), it should be appreciated that the leads may comprise any type of known, standardized, or yet-to-be developed configuration such as J leads, SOJ leads, gullwing, reverse gullwing, etc.

The leads and specifically the pins 116 may be configured to extend away from the first and second sections 112a, 112b. Specifically, where the first and second sections 112a, 112b are generally planar, the joint 124 between the section 112a, 112b and a pin 116 may correspond to the feature of the input side 104 where the lead diverges from the plane defined by the sections 112a, 112b. The taper 120 of the lead corresponds to the feature where the lead decreases is size and specifically decreases is cross-sectional area to a size sufficient to be inserted into a Printed Circuit Board (PCB) input or the like.

The output side 108 may also comprise a plurality of leads that are similar or identical to the leads of the input side 104. Much like the leads of the input side 104, each lead of the output side 108 may comprise a pin 136, a taper 140, and a joint 144. The output side 108 may differ from the input side 104 in that the output side 108 may comprise a plurality of sections 132a, 132b, 132c, 132d, where each section has a dedicated lead. Thus, if the output side 108 comprises four leads as is depicted in FIG. 1, then the output side 108 would comprise four sections 132a, 132b, 132c, 132d. It should be appreciated that the coupling system 100 may comprise a greater or lesser number of leads than those depicted. Specifically, the coupling system 100 depicted herein is intended for use as an 8-pin coupler. Embodiments of the present disclosure contemplate a coupling system 100 having 2 pins, 4 pins, 6 pins, 10 pins, 12 pins, or any other number of pins, whether odd or even.

A 4-pin coupler would likely comprise a coupling system 100 with two input pins 116 and two output pins 136. One of the input pins 116 would be connected to the first section 112a and the other of the input pits 116 would be connected to the second section 112b. Similarly, the output side 108 would only comprise a first section 132a and a second section 132b, each having their own dedicated pin 136.

Referring back to the depicted embodiment, the sections 132a, 132b, 132c, 132d of the output side 108 may be co-planar with the sections 112a, 112b of the input side 104. Each section of the output side 108 may be physically and electrically separated from one another in addition to being physically and electrically separated from the input side 104. As noted above, the relative positions of the input side 104 and output side 108 may be fixed by molding or encapsulating the leadframe in a plastic material. The plastic material may serve the secondary purpose of further electrically insulating the input side 104 from the output side 108 as well as electrically insulating each of the sections 132a-d of the output side 108.

Because the input side 104 is electrically and physically isolated from the output side 108, the coupling system 100 may further comprise a sensor assembly 148 that provide a link between the input side 104 and output side 108. Specifically, the sensor assembly 148 may be configured to detect magnetic fluxes, fields, or the like, created at the input side 104, convert the magnetic fluxes, fields, etc., into an electrical signal or electrical output and transfer the electrical signal or electrical output to the output side 108 via one or more conductive mechanisms.

Figure 2:
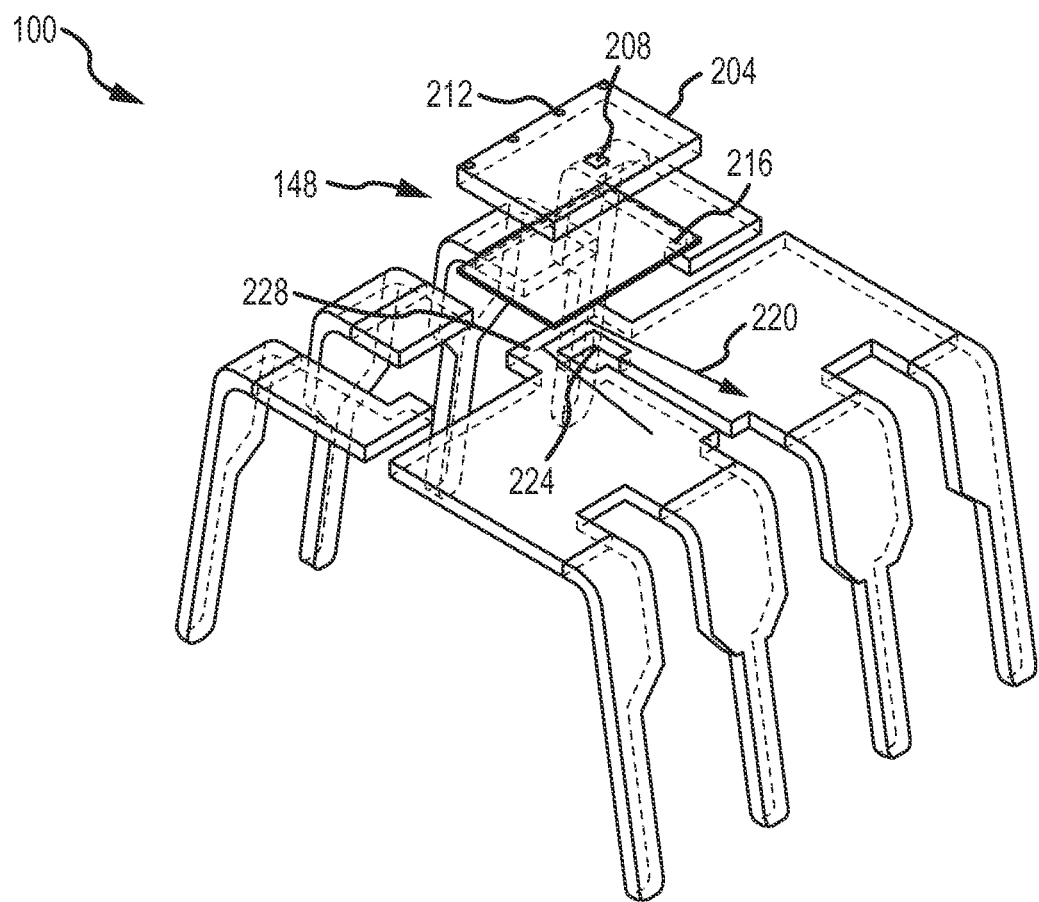
FIG. 2 is an exploded perspective view of the components depicted in FIG. 1.
Figure 4:
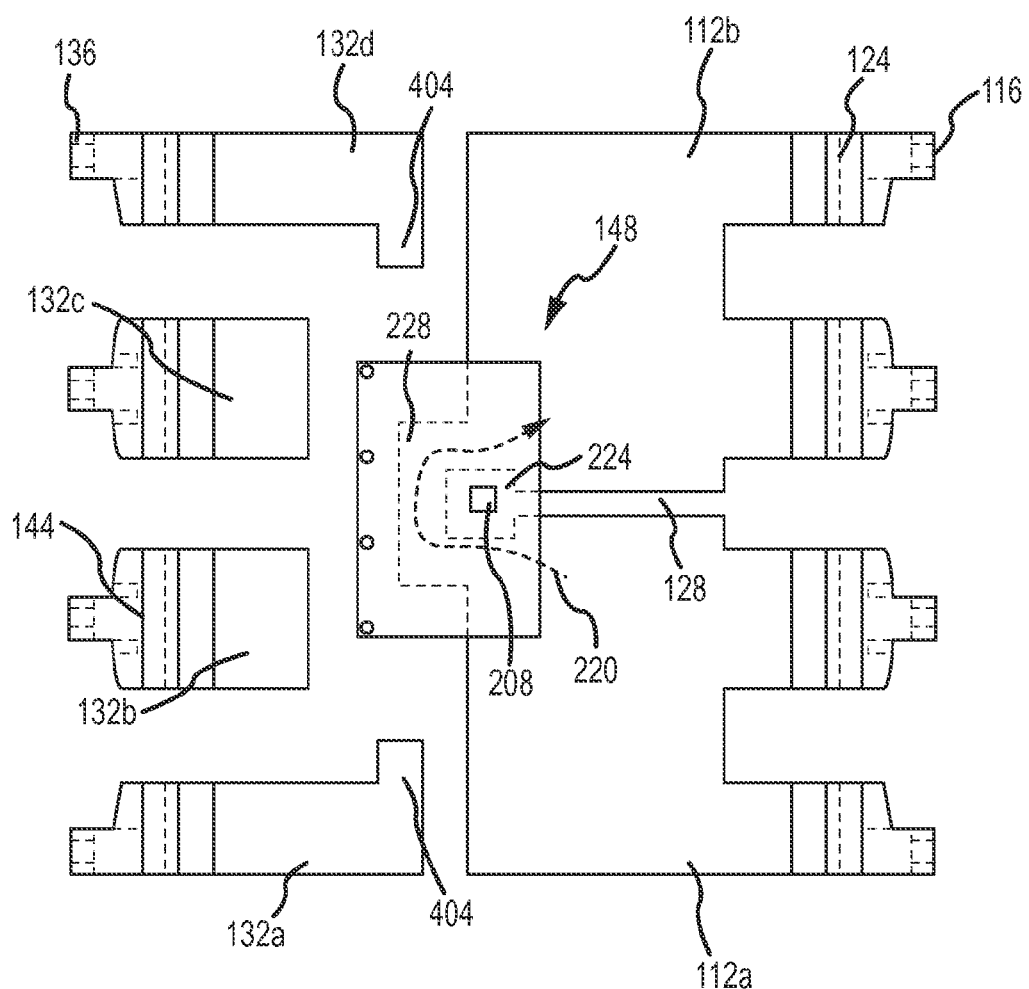
FIG. 4 is a top view of the components depicted in FIG. 1.

As can be seen in FIGS. 2 and 4, current may be configured to flow in a predetermined pattern through the input side 104. Specifically, the input side 104 may be constructed to force the current to flow in a path according to arrow 220. In some embodiments, the amount of current which flows through the input side 104 may be anywhere between about 1 A and 150 A. The sensor assembly 148 may be configured to convert the amount of current flowing through the input side 104 into smaller current amounts (e.g., current on the order of microamps or milli-amps). Even more specifically, since the input side 104 is configured to force the current flowing therethrough to flow in a curved or circular pattern, the input side 104 causes the flowing current to create a magnetic field as described by the Biot-Savart law or Ampere's law. This magnetic field is detected by the sensor assembly 148 and converted into an electrical signal (analog or digital) that has a current which is substantially less than the current flowing through the input side 104.

Since current generally follows the path of least resistance, the input side 104 is configured with a notch 224 at the terminus of the gap 128. The notch 124 may comprise a larger width than the gap 128 which causes the current to follow a non-linear path when flowing from the first section 112a to the second section 112b. More specifically, a current-directing feature 228 may be located adjacent to the notch 224 and the current-directing feature 228 may be responsible for carrying current from the first section 112a to the second section 112b. The current-directing feature 228 may be co-planar with the first and second sections 112a, 112b, but may be positioned above the ends of the sections (e.g., further away from the leads of the input side 104 than the ends of the sections 112a, 112b). Such a configuration of the input side 104 may enable the current flowing through the input side 104 to create a magnetic field that is strong enough to be detected by the sensor assembly 148.

Figure 3:
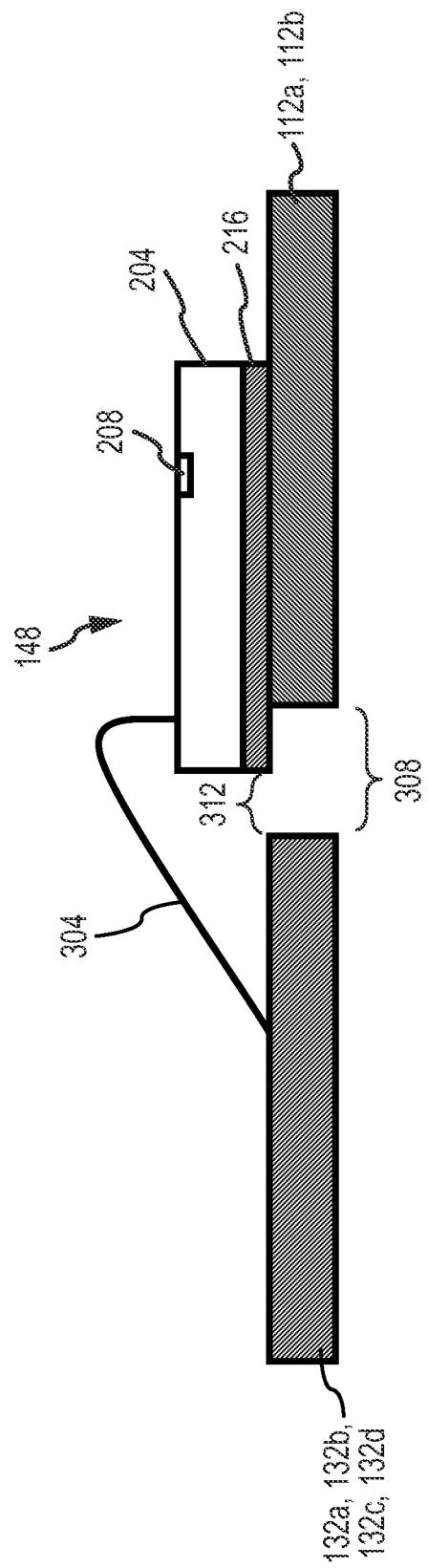
FIG. 3 is a cross-sectional view of the components depicted in FIG. 1.

With further reference to FIGS. 2-4, the sensor assembly 148 is shown to include a number of component parts that enable the sensor assembly 148 to detect a magnetic field and convert the detected magnetic field into an electrical signal that can be transferred to the output side 108. In some embodiments, the sensor assembly 148 may comprise a sensor carrier 204, a sensor element 208, one or more contacts 212, and an insulator 216. The sensor carrier 204 may correspond to any substrate made of plastic, ceramic, etc. and the sensor element 208 may correspond to any type of sensor or collection of sensors that is capable of sensing a magnetic field and producing a voltage/current that is proportional to the sensed magnetic field strength. In some embodiments, the sensor element 208 or the entirety of the sensor carrier 204 and sensor element 208 can be miniaturized into a silicon-based semiconductor element. A suitable type of sensor element 208 that may be employed is a hall-effect sensor or hall-sensing silicon Integrated Circuit (IC) chip. Examples of suitable sensor elements 208 and/or sensor assemblies 148 are described in further detail in U.S. Pat. Nos. 7,772,661; 7,042,208; 6,879,145; 5,572,058; 4,931,719; and 4,875,011, each of which are hereby incorporated herein by reference in their entirety.

As can be seen in FIGS. 3 and 4, the sensor assembly 148 may be positioned adjacent, above, or on the leadframe of the input side 104. In some embodiments, the sensor assembly 148 is mounted or placed on the first section 112a, the second section 112b, and the current-directing feature 228. Even more specifically, the insulator 216 of the sensor assembly 148 may comprise a first major surface and an opposing second major surface. The first major surface of the insulator 216 may be placed on the input side 104 and the second major surface of the insulator 216 may be located adjacent to the sensor carrier 204.

The insulator 216, in some embodiments, is used to enable the coupling system 100 to operate in connection with high input voltages at the input side 104. As a non-limiting example, the insulator 216 may be constructed of any non-conducting material such as polyimide, PPA, or any other type of polymer. The insulator 216 provides a physical separation between the current conductor (e.g., the leadframe of the input side 104) and the silicon (e.g., the sensor carrier 204 and/or sensor element 208). The insulator 216 is a layer that may be used to provide the high-voltage isolation between the sensor carrier 204 and/or sensor element 208 and the current flowing through the leadframe. The insulator 216 may also operate as an adhesive layer to attach the sensor carrier 204 and/or sensor element 208 onto the leadframe 104 of the input side 104.

The overall construction of the coupling system 100 and specifically the sensor assembly 148 may be designed to avoid electrically bridging the input side 104 to the output side 108, as this will compromise the internal creepage, thereby resulting in a high-voltage failure of the coupling system 100. In some embodiments, the thickness of the insulator 216 may be about 2 mils or greater. Where the surface area of the insulator 216 coincides with the surface area of the sensor carrier 204, the thickness of the insulator 216 may be 3 mils or greater to achieve a 5 kV rating for the coupling system 100. It should be appreciated that even larger thicknesses of an insulator 216 may be employed, but would result in an increased size of the coupling system 100. It may be possible that the thickness of the insulator 216 is larger than the thickness of the sensor carrier 204.

As can be seen in FIGS. 3 and 4, the sensor assembly 148 may overhang or extend further than the leadframe of the input side 104. Specifically, a leadframe isolation gap 308 may be defined as the minimum distance between the input side 104 and the output side 108. In some embodiments, the sensor assembly 148 may be positioned on the input side 104 so as to hang over or partially cover some of the leadframe isolation gap 308. The minimum distance between the leadframe assembly 148 and the output side 108 may be referred to as a sensor-output gap 312, which may be smaller than the leadframe isolation gap 308. In some embodiments, the sensor-output gap 312 may have a dimension of at least about 10 mils to achieve a 5 kV rating for the coupling system 100.

FIG. 3 also depicts a wire 304 that may be used to carry current from a contact 212 of the sensor assembly 148 to an output section 132*a*, 132*b*, 132*c*, 132*d*. The wire 304 may be constructed of any known type of conductive material or collection of conductive materials. In the depicted embodiment, the sensor assembly 148 has four contacts 212, where each contact may be connected to a different output section 132*a-d* by a different piece of wire 304. It should be noted that the number of contacts 212 does not necessarily have to equal the number of output sections 132. There may be a greater number of contacts 212 than output sections 132 or vice versa. Likewise, not every contact 212 has to be connected to an output section 132 or vice versa.

As can be seen in FIG. 4, one or more of the output sections 132*a-d* may comprise an arm 404 or similar feature which extends toward the contacts 212 of the sensor assembly 148. By providing the arm 404 on the output section 132, the amount of wire 404 that is required to connect the contact 212 to the output section 132 can be reduced, thereby reducing the likelihood of failure by virtue of the wire becoming broken or disconnected.

The relative position of the sensor element 208 and the notch 224 can also be seen in further detail in FIG. 4. Specifically, it may be desirable to position the sensor element 208 directly above the notch 224 or at some location where the magnetic field produced by the current flowing through the current-directing element 228 is the strongest. By positioning the sensor element 208 at such a location, the accuracy of the coupling system 100 can be increased and/or a less sensitive sensor element 208 can be employed, thereby resulting in a most cost-effective coupling system 100.

Figure 5:
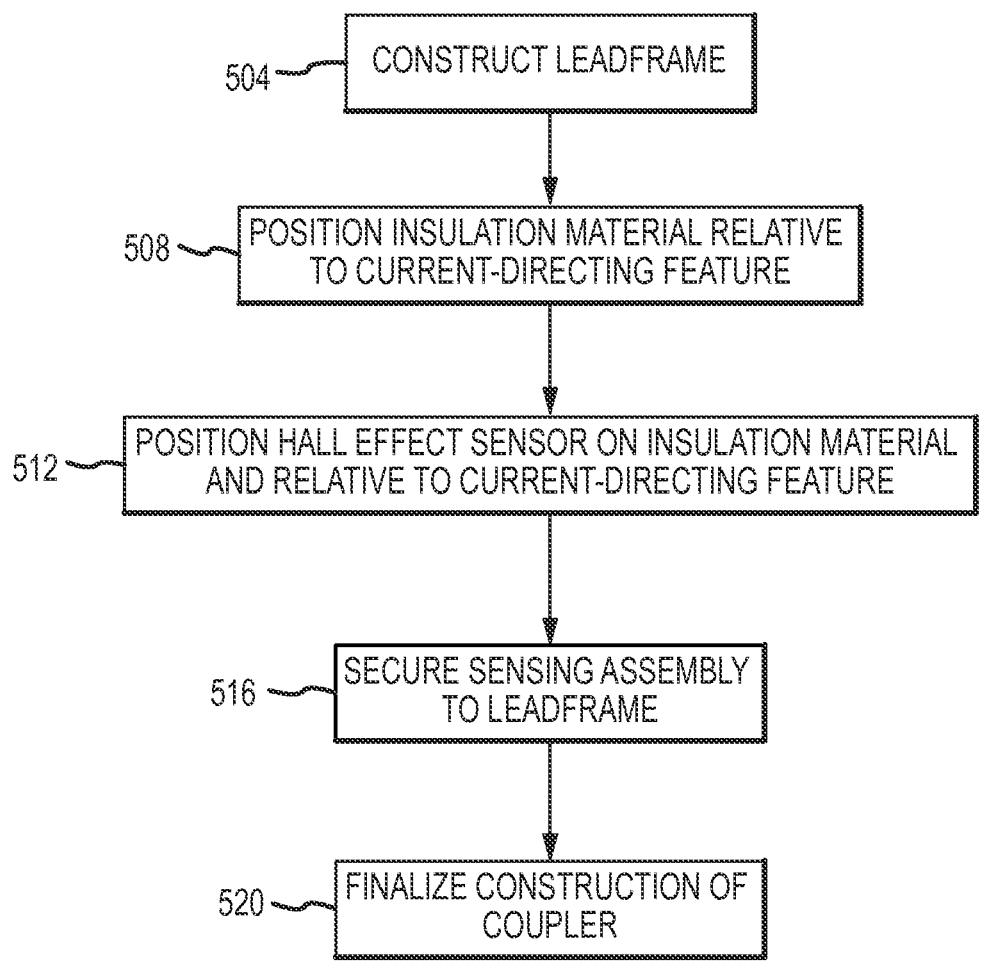
FIG. 5 is a flow diagram depicting a coupler manufacturing process in accordance with embodiments of the present disclosure.

With reference now to FIG. 5, one example of a method for constructing a coupler which incorporates the coupling system 100 will be described in accordance with embodiments of the present disclosure. The method is initiated with the construction of the leadframe (step 504). As noted above, both the input side 104 and output side 108 of the leadframe may be constructed simultaneously from a single sheet of metal.

Thereafter, the insulator 216 is positioned relative to the current-directing feature 228 or some other component of the input side 104 (step 508). The sensor element 208 and/or sensor carrier 204 may then be positioned on the insulator 216 such that the sensor element 208 is at an optimal position for detecting magnetic fields produced by current flowing through the current-directing feature 228 (step 512). It should be noted that steps 508 and 512 may be performed simultaneously.

Thereafter, the sensor assembly 148 may be electrically connected to the output side 108 via one or more wires 304 and then the entire coupling system 100 may be molded or otherwise have the relative positions of the component parts of the coupling system 100 fixed. In particular, the sensor assembly 148 may be secured to the leadframe and the wires connecting the sensor assembly 148 to the output side 108 of the leadframe may be encapsulated or molded in a plastic or epoxy (step 516). Any further steps required to complete the construction of the coupler may then be taken such as bending the leads of the leadframe, removing excess plastic from the mold which now encases the leadframe and sensor assembly 148, and so on (step 520).

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. A coupler, comprising:
 a leadframe including:
  an input side;
  and an output side that is electrically isolated from the input side; and
 a sensor assembly including a sensor element that is configured to detect a magnetic field produced by current flowing through the input side, produce an output signal having at least one of a current and voltage that is proportional to a magnitude of the detected magnetic field, and provide the output signal to the output side of the leadframe, the sensor element being positioned in the sensor assembly such that no portion of the sensor element overlaps any portion of the input side that carries the current flowing through the input side, wherein the sensor assembly further comprises an insulator along its entire bottom surface and which has an outer boundary substantially coincident with an outer boundary of the sensor assembly, wherein the insulator operates as an adhesive layer between the input side and the sensor assembly, wherein the sensor assembly and coincident insulator are also positioned such that at least a portion of the sensor assembly and coincident insulator do not overlap a portion of the input side, and wherein neither the sensor assembly nor the coincident insulator overlap any portion of the output side.

2. The coupler of claim 1, wherein the input side comprises a current-directing feature that detours current flowing through the input side in a loop and around the sensor element thereby creating the magnetic field.

3. The coupler of claim 2, wherein the input side comprises a first section and a second section that are separated by at least one isolation gap of a first distance, but are also connected to one another via the current-directing feature, wherein the current-directing feature detours the current flowing through the input side to have a travel path longer than the first distance.

4. The coupler of claim 2, wherein the current-directing feature, the input side, and the output side are constructed from a single sheet of metal.

5. The coupler of claim 1, wherein the outer boundary of the sensor assembly is exactly the same size and shape as the outer boundary of the insulator.

6. The coupler of claim 1, wherein the insulator comprises plastic, wherein the sensor element comprises a silicon-based hall-effect sensor, and wherein the silicon-based hall-effector sensor overlaps the at least a portion of the insulator.

7. The coupler of claim 1, wherein the sensor assembly is attached to a top surface of the input side.

8. The coupler of claim 1, wherein the input side is directly connected to a voltage source of at least 5 kV and wherein the insulator and a gap between the input side and output side prohibit transients from the 5 kV input side from reaching the output side.

9. The coupler of claim 1, wherein the input side comprises a notch, wherein the at least a portion of the insulator completely overlaps the notch, and wherein the sensor element is positioned in an overlapping arrangement with the notch such that the magnetic field is maximized around the sensor element.

10. The coupler of claim 1, wherein the output side comprises a plurality of output sections, each of which comprise a lead that is electrically connected to a contact on the sensor assembly by a wire.

11. A hall effect sensor coupler, comprising:
an input side that is electrically connected to a first circuit and carries a first current;
an output side that is electrically connected to a second circuit and is electrically isolated from the input side and first circuit;
a sensor assembly including a sensor element positioned relative to the input side such that at least some of the sensor assembly fails to overlap the input side that carries the first current and such that a magnitude of a magnetic field produced by the first current is detectable by the sensor element, wherein the sensor element fails to overlap any of the input side and is further configured to generate an output signal based on the detected magnitude of the magnetic field; and
an insulator completely underlying the sensor assembly and having an outer boundary substantially coincident with an outer boundary of the sensor assembly, wherein the insulator operates as an adhesive between the sensor assembly and the input side, wherein a portion of the sensor assembly and coincident insulator extends beyond the input side, and wherein no portion of the sensor assembly and coincident insulator overlap any portion of the output side.

12. The coupler of claim 11, wherein the output signal is generated in proportion to the magnitude of the magnetic field.

13. The coupler of claim 12, wherein the sensor element is part of a sensor assembly that is connected to the input side.

14. The coupler of claim 13, wherein the sensor assembly comprises the insulator, and wherein the insulator physically and electrically separates the sensor carrier and sensor element from the input side.

15. The coupler of claim 14, wherein the sensor carrier comprises an Integrated Circuit, wherein the insulator comprises a plastic, wherein the sensor element comprises a hall-effect sensor that is positioned within the sensor carrier such that none of the hall-effect sensor overlaps the input side, and wherein the hall-effect sensor overlaps the insulator.

16. The coupler of claim 14, wherein the insulator is at least about 2 mils thick thereby enabling the insulator along with a gap between the input side and output side to prohibit transients of up to 5 kV from traveling from the input side to the output side.

17. The coupler of claim 14, wherein a shortest distance from the input side to the output side is less than a shortest distance from the insulator to the output side.

18. A method of operating a coupler, comprising:
connecting an input side of the coupler to a first circuit operating at no less than 5 kV;
sensing a magnetic field produced by current flowing through the input side with a sensor element that is included in a sensor assembly, wherein the sensor element is positioned relative to the input side such that the sensor element does not overlap the input side or the current flowing through the input side;
converting the sensed magnetic field into an output signal;
providing the output signal to an output side of the coupler that is electrically isolated from the input side of the coupler; and
insulating the sensor assembly and sensor element from the input side with an adhesive insulator that provides a high-voltage isolation between the sensor assembly and the current flowing through the input side, wherein an outer perimeter of the adhesive insulator coincides with an outer perimeter of the sensor assembly, wherein a portion of the adhesive insulator and sensor assembly extend beyond the input side, and wherein the sensor element overlaps the adhesive insulator over a notch formed in the input side.

19. The method of claim 18, wherein the current flowing through the input side is directed along a non-linear path by the notch of the input side.

20. The method of claim 18, wherein a thickness of the adhesive insulator is greater than a thickness of the sensor assembly.

* * * * *